(12) United States Patent
Li

(10) Patent No.: US 8,297,226 B2
(45) Date of Patent: Oct. 30, 2012

(54) DEPOSITION BOX FOR SILICON-BASED THIN FILM SOLAR CELL

(75) Inventor: Yi Li, Shenzhen (CN)

(73) Assignee: Shenzhen Trony Science & Technology Development Co., Ltd., Shenzhen (CN)

( * ) Notice: Subject to any disclaimer, the term of this patent is extended or adjusted under 35 U.S.C. 154(b) by 0 days.

(21) Appl. No.: 13/389,800

(22) PCT Filed: Oct. 21, 2010

(86) PCT No.: PCT/CN2010/001658
§ 371 (c)(1),
(2), (4) Date: Feb. 9, 2012

(87) PCT Pub. No.: WO2011/153674
PCT Pub. Date: Dec. 15, 2011

(65) Prior Publication Data
US 2012/0142138 A1 Jun. 7, 2012

(30) Foreign Application Priority Data
Jun. 11, 2010 (CN) .......................... 2010 1 0198688

(51) Int. Cl.
*C23C 16/59* (2006.01)
*H01L 31/18* (2006.01)

(52) U.S. Cl. ..................... 118/723 E; 427/457; 427/533; 438/485; 156/345.44

(58) Field of Classification Search .................. 427/457, 427/533; 438/485; 118/723 E; 156/345.44
See application file for complete search history.

(56) References Cited

U.S. PATENT DOCUMENTS

| 4,723,508 | A | * | 2/1988 | Yamazaki et al. | ........ 118/723 E |
| 5,538,610 | A | * | 7/1996 | Gesche et al. | ............ 204/298.15 |
| 2012/0139416 | A1 | * | 6/2012 | Li | ................................... 315/85 |
| 2012/0142137 | A1 | * | 6/2012 | Hu et al. | .......................... 438/57 |
| 2012/0142138 | A1 | * | 6/2012 | Li | ................................... 438/57 |

FOREIGN PATENT DOCUMENTS
CN 101245450 A 8/2008

OTHER PUBLICATIONS

Jun-ming Xue, et al., "Making Large Even Silica Based Films by Using the VHF-PECVD Technology", Journal of Solar Energy, pp. 1227-1232, Issue 11, vol. 28 (Nov. 2007).

* cited by examiner

*Primary Examiner* — Sylvia R. MacArthur
(74) *Attorney, Agent, or Firm* — Anova Law Group, PLLC; Weyne Tan

(57) ABSTRACT

A movable deposition box (02) for silicon-based thin film solar cell comprises an electrode array composed of at least a group of cathode plates (203) and a piece of anode plate (208) which are set in movable chamber, wherein a feeding socket (203-1) is positioned on a circular or semicircular concave surface in the center area on the backside of the cathode plates (203), a circular or semicircular end face (201-1) of a feeding component (201) which has a flat middle part contacts the signal feeding socket (203-1) and feeds in RF/VHF power signal, the anode plate (208) is grounded, and a shield cover (204) of the cathode plate has through-hole (204-1) and is insulated from the cathode plate (203).

11 Claims, 3 Drawing Sheets

DEPOSITION BOX FOR SILICON-BASED THIN FILM SOLAR CELL

FIELD OF THE INVENTION

The present invention generally relates to solar cell technologies and, more particularly, to a deposition box driven by VHF (27.12 MHz-100 MHz) for silicon-based thin film solar cells.

BACKGROUND

Currently, silicon thin film solar cells often use plasma enhanced chemical vapor deposition (PECVD) to deposit single-junction or multi junction photovoltaic PIN film layers. This type of radio-frequency (RF) capacitively-coupled parallel plate reactor is commonly used in the thin film solar cell industry. Deposition process, such as plasma-enhanced chemical vapor deposition, is conducted in the reaction chamber through electrode plate components with electrode plate array. RF capacitively-coupled parallel-plate electrode reaction chamber is widely used in various kinds of large area thin film deposition of amorphous silicon, amorphous silicon germanium, silicon carbide, silicon nitride, and silicon oxide materials, etc. Industry-wide, the electrode with a supporting frame is usually called a clamping unit, a holder, or a fixture, and the plasma chemical vapor deposition apparatus with installed holders inside the chamber is often called the "deposition box," i.e., the reactor.

The silicon thin film solar cell sector is an important branch of the solar energy industry, and the parallel plate electrode capacitive discharge pattern is one of the core technologies of the solar cell industry. Further, 13.56 MHz RF is widely used in high-speed amorphous silicon thin film deposition with high production efficiency and low process cost. With the rising demand for silicon thin film technology, more attention has been given to microcrystalline and nanocrystalline silicon thin film materials.

However, in a microcrystalline environment, plasma generated by 13.56 MHz RF may have low plasma concentration, low deposition rate, long deposition period to reach targeted film thickness, and significant background pollution. Thus, the prepared thin film often has high impurity and poor photoelectric properties, which seriously affects the quality and performance of the products. How to make high-speed deposition becomes key for crystalline silicon thin-film technology to successfully serve the industry.

Very high frequency (VHF) is referred to the legitimate frequency which is twice or more of 13.56 MHz. In the industry, the VHF mostly used is generally in the range of 27.12-100 MHz. However, in the capacitive discharge model, standing wave effect and skin effect caused by VHF become very obvious, and these effects become stronger when the driving frequency increases. Professor M. A. Lieberman of University of California, Berkeley made a thorough investigation on these two effects. His research results show that the critical condition for VHF PECVD deposition of uniform thin films is that the free space wavelength of excitation frequency ($\lambda_0$) is much larger than the capacitive discharge electrode chamber size factor (X), and the skin depth ($\delta$) is much larger than the thickness tolerance factor ($\eta_0$). For example, on 1 m$^2$ of discharging area and with an excitation frequency of 60 MHz, $\lambda_0 \approx X$ and $\delta \approx \eta$. Therefore, under this excitation frequency, the skin effect and the standing wave effect become very obvious, leading to an uneven discharge on the electrode plate of 1 m$^2$. Thus, how to achieve a large area of uniform discharge driven by VHF is one of the technical problems to be resolved for the crystalline silicon thin-film technology.

This also caused great interest in the industry. In 2003, U.S. Patent 2003/0150562A1 disclosed a method using a magnetic mirror in the capacitively-coupled discharge to improve the inhomogeneity caused by VHF. Chinese patents 200710150227.4, 200710150228.9, and 200710150229.3 disclosed three electrode designs of VHF, applying different feed-in forms of VHF signals to obtain uniform electric fields.

However, the following problems may still remain: 1) The electrodes in the VHF-PECVD chamber have complex design structures; 2) One reason for the continuous improvement is that the constant assembly/disassembly and cleaning of the reaction chamber and electrodes can cause abnormal deformation of the electrodes; 3) The multi-point feed-in structures disclosed in the existing patents may have a small contact surface, which requires symmetrical paths of individual feed-in points and there is no contact between the bonding conductors at the feed-in points and the cathode plate. More specifically, a shield of isolation may be needed between the bonding conductor and the cathode plate for effective discharge. These structural designs have relatively harsh actual requirements, have too many determination factors for uniform discharge, and cannot meet the actual production needs such as disassembly and cleaning.

Therefore, for the equipment used by the industry, a single point feed-in becomes the mainstream design. But due to the standing wave effect and the skin effect, current single-point feed-in structures cannot meet the requirement for increasing the high feed-in frequency. Thus, further development and improvement may be needed to make the existing deposition holders more practical to meet the current market demand and to reduce the cost. Meanwhile, it is also a trend to use CVD reactor system capable of processing or depositing multiple glasses. Therefore, it is of great practical significance for the industry to apply an effective VHF feed-in model to meet the demand of mass production and to enter the industrial production stage.

CONTENTS OF THE INVENTION

The aims of the invention include solving the non-uniformity problem of VHF power-driven discharge system, and providing a large-area VHF-PECVD deposition chamber with a uniform electric field through using a new conceptual design of the electrode array having electrode plate components, which is applied in the production of large area VHF-PECVD electrode plate multi-plate array.

Accordingly, the deposition box technology solutions in the invention include: an electrode plate component, a signal feed-in component and the chamber, also including the shielding cover of the cathode plate, the chamber is a movable chamber with rollers, inside which installed the electrode array consisting of the electrode plates. The feed-in port is located in a hollowed circular or semicircular area at the center of the backside of the electrode plate component; the signal feed-in component connecting with the circular or semicircular-shaped feed-in port by surface contact connects with the negative electrode of the feeding Radio Frequency (RF) or Very High Frequency (VHF) power supply signals. The shielding cover of the cathode plate has a through hole. It is insulated between the cathode plate and the shielding cover, and the electrode array includes at least one set of cathode plates and one anode plate.

The set of cathode plates and an anode plate, mentioned in the solutions of the deposition box, refers to two effectively discharging sides of the symmetrically-arranged cathode plates facing towards two sides of the anode plate. The cathode plate is used for single-side discharge, and the shielding cover of the cathode plate includes a ceramic insulating layer and a shielding layer. The shielding cover covers entire back and side surface of the cathode plate.

The electrodes include multiple cathode plates with shielding covers and multiple grounded anode plates to form the electrode array with certain discharging space.

The shielding cover includes the shielding of the center position of the backside of the cathode plate and the surrounding sides for feeding in RF/VHF power supply signals. The signal feed-in component comprises a copper feed core, the insulating layer and the outer shielding layer.

The signal feed-in component comprises a waist and a head, which has a Z-shape. The waist has a high-temperature tolerant ceramic insulating layer, and the metal feeding core is a conductor of RF/VHF feeding lines. One end of the signal feed-in component is connected with a negative output port of the RF/VHF power supply signal and a power supply matching device.

The solution of the present invention provides a method, in which the electrode plate component, the feed-in component and a chamber form a signal feed-in mode, and the electrode array is installed in the movable chamber with rollers. The electrode array includes at least one set of cathode plates and one anode plate. The feed-in port is located in a hollowed circular or semicircular area at the center of the backside of the electrode plate component, the feed-in component is connected with the cathode plate in the circular or semicircular concave surface by surface contact. Further, one end of the signal feed-in component is of a circular or semicircular shape and makes surface contact with a feed-in port of the electrode plate component to feed-in RF/VHF power supply signals.

The solution of the present invention includes that a plurality of sets of feed-in components and the electrode plates feed the RF/VHF power supply signal into electrode plate feed entrance through surface contact mode, forming an electrode array with certain discharge space.

The feed-in component may be a Z-shape metal belt or strip, the waist has a high temperature tolerant ceramic insulating layer and metal feeding core is a conductor of RF/VHF signal feeding lines.

One end of the signal feed-in component is connected with a negative output port of the RF/VHF power supply signal and a power supply matching device.

The beneficial effects of the present deposition box invention, different from the slot-type cathode plate with side feed modes, include that deposition which achieves the higher uniformity, greater discharge area and the stable discharge performance can be obtained in the deposition box, the connection capacitance is smaller, the actual discharge power is greater, and the radio frequency interference between electrode plate arrays is smaller. Also different from cathode plate center-point-type feed mode of the single chamber deposition system, the connection capacitance is smaller, the standing wave and the skin effect is smaller, and the integrated array type multi-chamber deposition can be obtained to greatly improve production efficiency. Therefore, through optimizing VHF power feed-in form and electrode plate structure, the solution of RF/VHF discharge uniformity can be obtained, and it is the premise of high efficient preparation technology for crystallized silicon thin film. The invention is applicable for any power and any legitimate VHF frequencies in the range of 27.12 MHz~200 MHz for large area uniform discharge. This structure can be applied to multiple-glasses deposition systems for greatly improving the productivity and reducing the cost of solar cells. The invention breaks through the conventional electrode design technical limitations, effectively eliminates the VHF inducing effects such as a standing wave and the skin effect, and improves uniform discharge to industrial application level.

BRIEF DESCRIPTION OF THE DRAWINGS

In FIG. 1-8, deposition box 02 is composed of signal feed-in component 201, insulating shielding layer 202, cathode plate 203, cathode plate shielding cover 204, substrate 206, insulating strip 207, anode plate 208, grounding metal guide groove 209, bottom back-door plate 211, upper back-door plate 212, gas cavity 214, a front door panel 215, the side frame 216, wheels or rollers 218, gas pipeline 220, and a bottom base plate 221, etc., to process gas deposition in a vacuum chamber 01. Vacuum chamber 01 contains the feed-in inlet 101 of gas access system, the power supply feeding system inlet 102, vacuum chamber door 103, track 104, and the feed-in inlet 105 of vacuum system.

Figure 1:
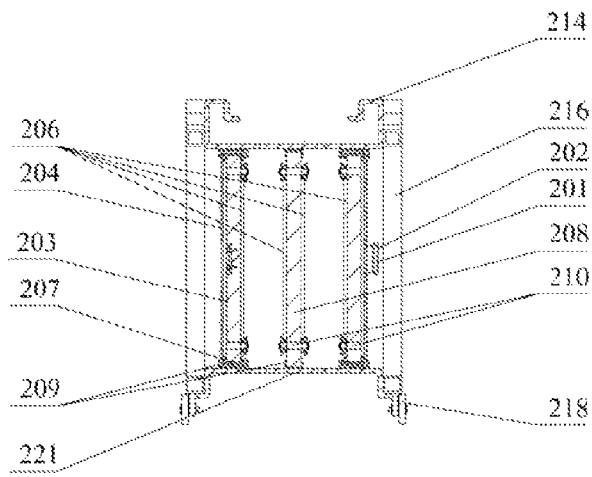
FIG. 1, deposition box section view.
Figure 2:
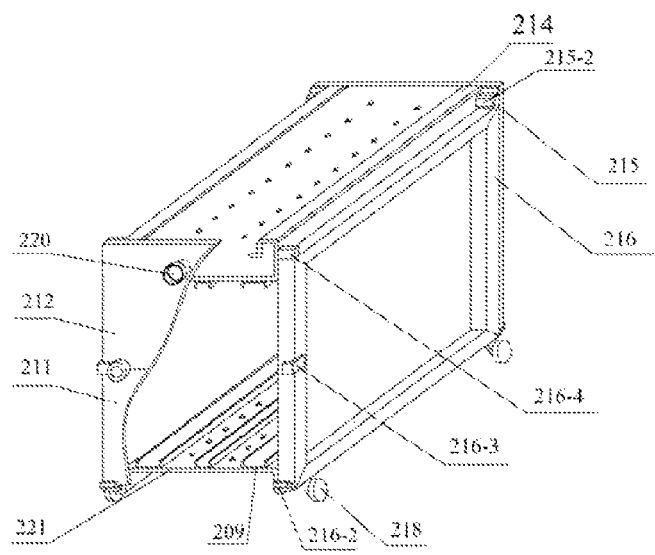
FIG. 2, deposition box chamber diagram.
Figure 3:
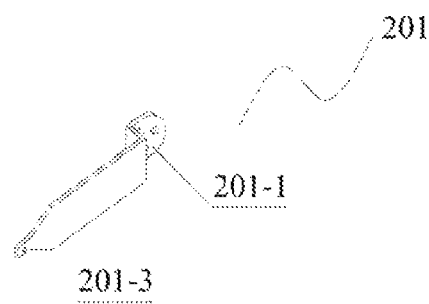
FIG. 3, a schematic diagram of the signal feed-in component 201 of FIG. 1.
Figure 4:
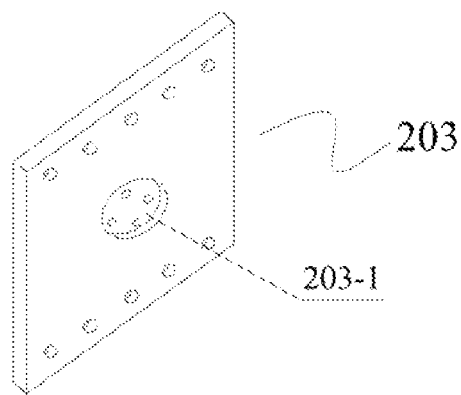
FIG. 4, a schematic diagram of the cathode plate 203 of FIG. 1.
Figure 5:
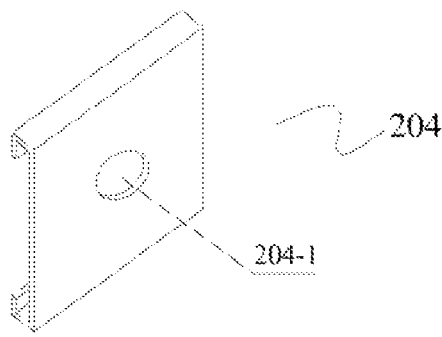
FIG. 5, a schematic diagram of the cathode plate shield 204 of FIG. 1.
Figure 6:
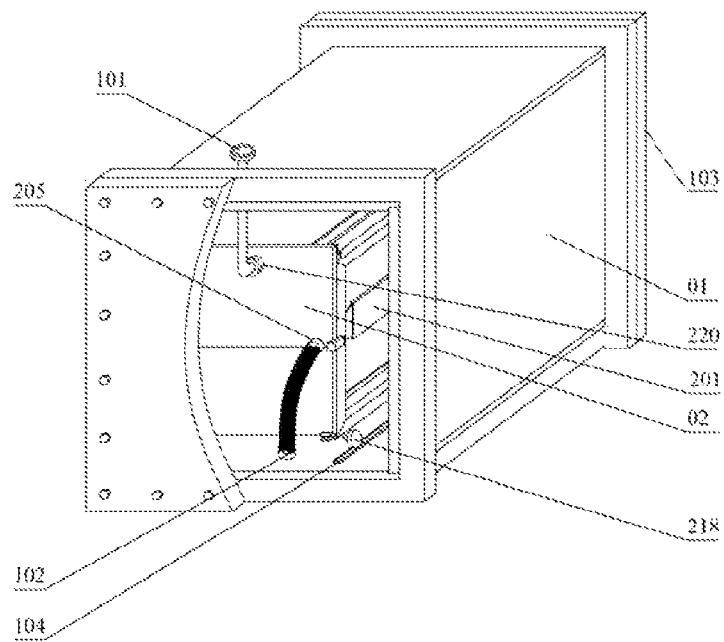
FIG. 6, a structure sketch diagram of the embodiment 1 of the invention.

The invention of the deposition box achieves the above proposed invention task through a surface contact feed-in mode. It has overcome many problems from multi-point feed-in techniques in VHF-PECVD deposition of crystallized silicon thin film, such as that the electrode structure of reaction chamber is complex, electrode easily deforms, contact area is small, path and distance between the feed-in points require completely symmetric and fully shielded, etc. The surface feeding deposition box design of the invention solves these problems and can obtain a large area chamber discharge with uniform electric field. It especially can achieve high efficient utilization of the dual work surfaces of the anode plate. Meanwhile, for the CVD deposition box system for treating or depositing more pieces of glasses, the effective VHF surface feed-in mode is applied so that the industrial production operation process is achieved and can meet the silicon-based thin film solar cell mass production needs.

Contribution of this invention includes providing a substantial solution to uniformity and consistency problems of thin-film deposition driven by a very-high-frequency (VHF) electrical power source at a high deposition rate. Deposition box 02 is placed in vacuum chamber 01, and the deposition box 02 comprises electrode plates, signal feed-in component, chamber and cathode plate shielding cover 204. Parallel electrode plates include cathode plate 203 and anode plate 208. Feed-in port 203-1 of cathode plate is circular shaped. Signal feed-in component 201 is of a stair shape and comprises a waist section and a semi-circular end 201-1, which connects with circular feed-in port 203-1 sunken in the middle of cathode plate 203 with shielding cover 204. The waist of the component is flat for easy installation and with less feed-in signal loss. The other end 201-3 of the component connects with the negative port of RF/VHF electrical power source and a power matching device (not depicted in figures), and is of the shape of stairs. The end of the component is of a semi-circular shape, connects in surface-contact mode with electrode plate to constitute the electrode-plate component in the deposition box with grounding setting, which all have insulating shields (not depicted in figures).

DETAILED DESCRIPTION OF THE EMBODIMENTS

Embodiment 1

Electrode plates are vertically placed. Cathode plates have circular feed-in ports, and feed-in components have flat waists and semi-circular feed-in interfaces.

The principle of this embodiment is illustrated with FIGS. 1-6. In deposition box 02, two cathode plates 203 surround one anode plate 208. PECVD deposition system consists of vapor deposition chamber, gas system, electrical power system, vacuum system, heating system, control system, and so on. Gas system mainly provides different gases and gas lines for vapor deposition. Electrical power system mainly provides high-frequency or very-high-frequency electrical power source to discharge plasma for film deposition. Vacuum system mainly provides vacuum pumping machines and vacuum pipelines. Heating system mainly supplies heat for vapor deposition chamber. Control system mainly controls the parameters of deposition process. Vapor deposition chamber is the apparatus for realizing thin film deposition with gases on substrate 206.

The vapor deposition chamber mainly comprises vacuum chamber 01, and deposition box 02 with scroll wheels 218 and grounding setting. Vacuum chamber 01 is used to achieve vacuum. Deposition box 02 is used to discharge plasma and deposit P-I-N thin film layers on substrate 206. Deposition box 02 includes cathode plate 203, cathode shield 204, insulating strip 207, anode plate 208, signal feed-in component 201, shielding layer 202, bottom plate 221, gas chamber 214, grounding metal groove 209, front-door plate 215, upper back-door plate 212, bottom back-door plate 211, side frame 216, and wheel 218. Side frame 216 is a quadrangle frame made of welded stainless steel slip, which has rectangular hook ear 216-4. Side frame 216 connects with gas chamber 214 on top side and with bottom plate 221 on bottom side to form an integral body. Metal groove 209, located on the counterpart side of gas chamber 214 and bottom plate 221, can fix anode plate 208, cathode plate 203, and cathode shield 204. Anode plate 208 is directly inserted into and contacts metal groove 209, making cathode shield 204 contact metal groove 209. Insulating slip 207 is fixed between cathode 203 and cathode shield 204 to make these two parts separate.

Anode plate 208 and cathode shield 204 contact metal grooves 209, which connects with bottom plate 221 to acquire grounding. A circular feed-in port 203-1 is located in the middle or center area of cathode plate and sunken from the surface of the plate. Waist and head of signal feed-in component 201 form the shape of Z. Further, signal feed-in component 201 has a semi-circular end 203-1 to connect sunken circular port in the middle of cathode plate with radio-frequency/very-high-frequency signal power source. Through hole 204-1 in the middle of cathode shield 204 is set corresponding the feed-in port 203-1 and makes signal feed-in component 201 coming from cathode plate 203 without touching cathode shield 204. Another end of signal feed-in component 201 connects with electrical power supply port 205 through hole 201-3. Waist of the feed-in component is covered with high-temperature tolerant ceramic insulating layer 202 to avoid contacting with cathode shield 204. Signal feed-in component is made from copper with good conductivity. Front door plate 215 can make deposition box 02 to form a relatively enclosed space by hanging hook 215-2 on hook ear 216-1 on side frame 216 and inserting bottom side into Z-shaped socket, after substrates 206 are placed in deposition box 02. Deposition box 02 can be pushed into vacuum chamber 01 through track 104. Thus, top inlet of gas pipe line 220 on deposition box 02 connects with inlet of gas system 101 of vacuum chamber 01 by inserting into the pipe of vacuum chamber. Desired vacuum state of vacuum chamber can be achieved after movable vacuum door 103 in vacuum chamber 01 is closed. Then gases are added into vacuum chamber, and thin-film vapor deposition proceeds.

Embodiment 2

Electrode plates are vertically placed. Cathode plates have circular feed-in ports. Feed-in components have flat waists and semi-circular feed-in interface. Cathode plates are insulated from shields and through holes are set in the shields of cathode plates.

Figure 7:
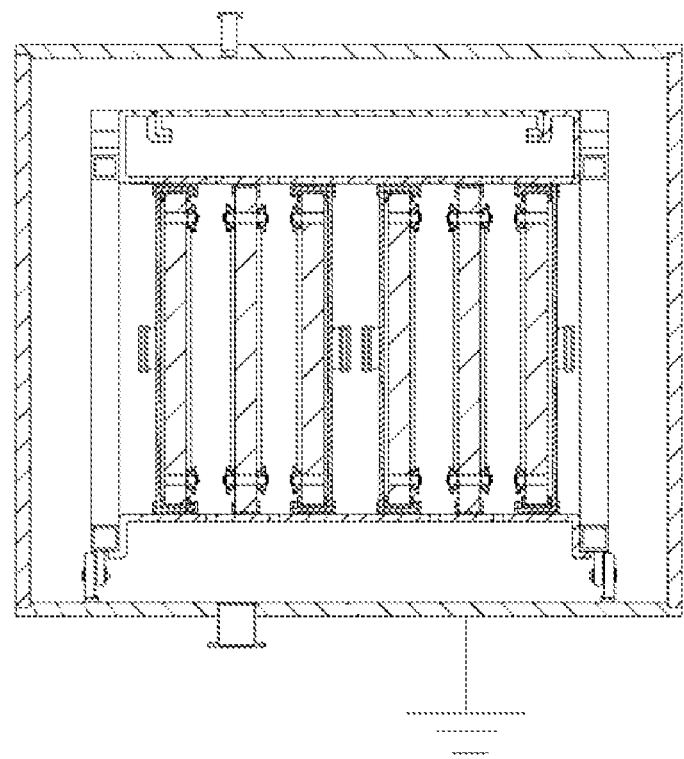
FIG. 7, a structure sketch diagram of the embodiment 2 of the invention.

Deposition box in FIG. 7 is the same as that in Embodiment 1, in which 8 glass substrates 206 can be processed at the same time. Two cathode plates 203 surround one anode plate 208, and four pairs of electrodes can be formed by two anode plates 208 and four cathode plates 203. In such a configuration, eight substrates can be coated with thin films at the same time. Detailed processes are illustrated as follows:

a) Place 8 glass substrates (1640 mm×707 mm×3 mm) with 600-nm transparent conducting thin films in the substrate position in deposition box 02. Film side of the substrate faces outside, while glass side of the substrate faces toward electrode plate.

b) Open the active door 103 of the vacuum chamber, and push the deposition box 02 along the track 104 into the vacuum chamber 01. Then close the active door 103 of the vacuum chamber 01.

c) Fill the chamber with argon when vacuum reaches $5.0\times10^{-4}$ Pa. Turn on the 40.68 MHz very-high-frequency power source, and clean the chamber with 400 W plasma discharge for 2 minutes. Then turn off the electrical power source.

d) Afterwards, pump down the system to a high vacuum of $\sim 5.0\times10^{-4}$ Pa, and then wash the system with argon twice.

e) Add gas mixture (silane and hydrogen) to the chamber with a flow rate of 5 slpm. Turn on the 40.68 MHz very-high-frequency power source when pressure of the chamber reaches 60Pa. Glow the plasma discharge with 400 W power, and deposit micro-crystalline intrinsic silicon thin films for 40 minutes.

f) Turn off the power source, and pump down the system to high vacuum.

g) Fill the chamber with nitrogen gas to atmospheric pressure, and open the active door 103 of the chamber. Push deposition box 02 out of the chamber, and then cool the TCO glasses at room temperature.

With this feed-in configuration, uniform electric field driven by 40.68 MHz very-high-frequency power source can be achieved, and micro-crystalline silicon thin films can be deposited on 1640 mm×707 mm (length×width) TCO glass with a uniformity of ~5% and adjustable micro-crystallization degree.

Embodiment 3

Electrode plates are vertically placed. Cathode plates have circular feed-in ports. Feed-in components have flat waists and semi-circular feed-in interface. Cathode plates are insulated from shields and through holes are set in the shields of cathode plates.

Figure 8:
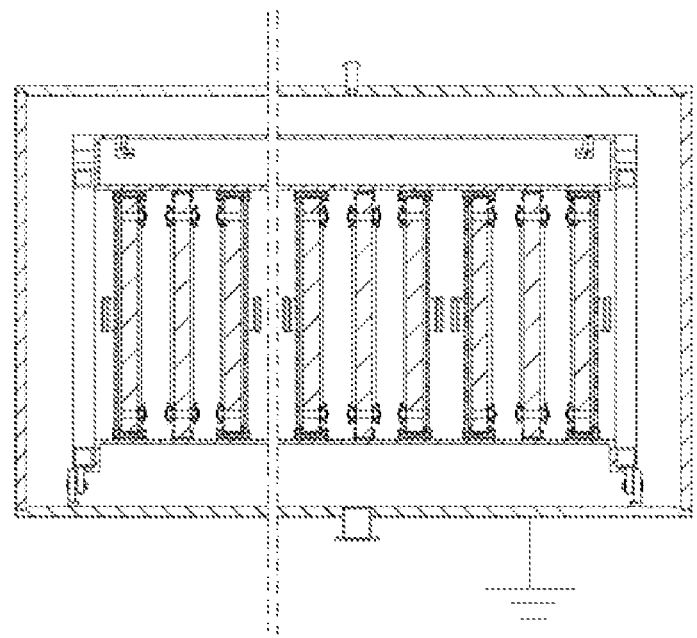
FIG. 8, a structure sketch diagram of the embodiment 3 of the invention.

Deposition box in FIG. 8 is the same as that in Embodiment 1, in which 24 glass substrates 206 can be processed at the same time. Two cathode plates 203 surround one anode plate 208, and twelve pairs of electrodes can be formed by six anode plates 208 and twelve cathode plates 203. In such a configuration, twenty four substrates can be coated with thin films at the same time. Detailed processes are illustrated as follows:

a) Place 24 glass substrates 206 (1640 mm×707 mm×3 mm) with 600-nm transparent conducting films in the substrate position in deposition box 02. Film side of the substrate faces outside, while glass side of the substrate faces toward electrode plate.

b) Open the active door 103 of the vacuum chamber, and push the deposition box 02 along the track 104 into the vacuum chamber 01. Then close the active door 103 of the vacuum chamber 01.

c) Fill the chamber with argon when vacuum reaches $5.0 \times 10^{-4}$ Pa. Turn on the 40.68 MHz very-high-frequency power source, and clean the chamber with 400 W plasma discharge for 2 minutes. Then turn off the electrical power source.

d) Afterwards, pump down the system to a high vacuum of $\sim 5.0 \times 10^{-4}$ Pa, and then wash the system with argon twice.

e) Add gas mixture (silane and hydrogen) to the chamber with a flow rate of 5 slpm. Turn on the 40.68 MHz very-high-frequency power source when pressure of the chamber reaches 60 Pa. Glow the plasma of 400 W, and deposit microcrystalline intrinsic silicon thin films for 40 minutes.

f) Turn off the electrical power, and pump down to high vacuum.

g) Fill the chamber with nitrogen gas to atmospheric pressure, and open the active door 103 of the chamber. Push deposition box 02 out of the chamber, and then cool the TCO glasses at room temperature.

With this feed-in configuration, uniform electric field driven by 40.68 MHz very-high-frequency power source can be achieved, and micro-crystalline silicon thin films can be deposited on 1640 mm×707 mm (length×width) TCO glass with a uniformity of ~4.8%.

Above descriptions illustrate embodiments of this invention in details together with the accompanying figures. However, the present invention is not limited to the above embodiments, especially with respect to the shape of the feed-in components. Those with ordinary skills in the art can make different changes to this invention without departing the principles of the present invention.

What is claimed is:
1. A deposition box for silicon-based thin film solar cells, comprising:
an electrode plate component;
a signal feed-in component; and
a chamber, wherein:
electrode plate component includes a cathode plate and a shielding cover of the cathode plate, the shielding cover includes a ceramic insulating layer and a shielding layer, the chamber is a movable chamber with rollers and contains installed the electrode array composing of the electrode plate;
a feed-in port is located in a sunken circular or semicircular area at the center of the backside of the cathode plate of the electrode plate component;

the signal feed-in component connecting with the feed-in port by surface contact connects with the negative electrode of the feeding Very High Frequency (VHF) power supply signals;
one end surface of the signal feed-in component is circular or semicircular;
the shielding cover of the cathode plate corresponding to the feed-in port has a through hole;
the cathode plate is insulated from the shielding cover;
the electrode array has at least one set cathode plates and one anode plate; and
the cathode plate is single-surface discharging, and the shielding cover covers entire back and side surfaces of the cathode plate.

2. The deposition box for silicon-based thin film solar cells according to claim 1, wherein:
one set cathode plates and one anode plate are arranged by placing one anode plate with two surfaces to face separately towards the active discharging working area of two symmetrically standing cathode plates.

3. The deposition box for silicon-based thin film solar cells according to claim 1, wherein:
the signal feed-in component includes a copper feeding core, insulating layer and shielding layer.

4. The deposition box for silicon-based thin film solar cells according to claim 1, wherein:
the electrodes includes multiple cathode plates with shielding covers and multiple grounded anode plates to form the electrode array with certain discharging space.

5. The deposition box for silicon-based thin film solar cells according to claim 4, wherein:
the shielding cover includes the shielding of the center position of the back side of the cathode plate and the surrounding sides for feeding in VHF power supply signals.

6. The deposition box for silicon-based thin film solar cells according to claim 4, wherein:
the signal feed-in component includes a waist and a head, which has a Z shape, the waist has a ceramic insulating layer, and the metal feeding core is a conductor of VHF feeding lines.

7. The deposition box for silicon-based thin film solar cells according to claim 1, wherein:
one end of the signal feed-in component is connected with a negative output port of the VHF power supply signal and a power supply matching device.

8. A signal feed-in method of the deposition box for silicon-based thin film solar cells, comprising:
an electrode plate component, a feed-in component, and a movable chamber with rollers for a signal feeding mode, wherein:
the electrode array is installed in the movable chamber with rollers; the electrode array has at least one set cathode plates and one anode plate;
the feed-in port is located in a sunken circular or semicircular area at the center of the backside of the cathode plate of the electrode plate component, and the feed-in component is surface connected with the cathode plate;
the electrode plate signal is fed in through surface contact mode;
one end of the signal feed-in component is of a circular or semicircular shape and makes surface contact with a feed-in port which is circular or semicircular shape of the cathode plate to feed-in VHF power supply signals;
the cathode shielding cover and anode plate are grounded, the shielding cover of the cathode plate includes a ceramic insulating layer and shielding layer;

the cathode plate is single-surface discharging, and the shielding cover covers entire back and side surface of the cathode plate, and the shielding cover of the cathode plate corresponding to the feed-in port has a through hole.

9. The signal feed-in method of the deposition box for silicon based thin film solar cells according to claim 8, wherein:
the electrode array includes multiple feed-in components and electrode plate components; and the VHF power supply signal is fed to feed-in port of the electrode plate by surface feeding method to form the electrode array with certain discharging space.

10. The signal feed-in method of the deposition box for silicon based thin film solar cells according to claim 8, wherein:
the waist of "Z shape" feed-in component has ceramic insulating layer, while the metal feeding core is a conductor of VHF signal feeding lines.

11. The signal feed-in method of the deposition box for silicon based thin film solar cells according to claim 10, wherein:
one end of the signal feed-in component is connected with a negative output port of the VHF power supply signal and a power supply matching device.

* * * * *